(12) United States Patent
Kum et al.

(10) Patent No.: US 12,288,772 B2
(45) Date of Patent: Apr. 29, 2025

(54) TILED DISPLAY DEVICE

(71) Applicant: Samsung Display Co., LTD., Yongin-si (KR)

(72) Inventors: Sang Seop Kum, Yongin-si (KR); Beom Jun Kim, Yongin-si (KR); Seung Kyu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 869 days.

(21) Appl. No.: 17/222,394

(22) Filed: Apr. 5, 2021

(65) Prior Publication Data

US 2022/0102322 A1    Mar. 31, 2022

(30) Foreign Application Priority Data

Sep. 28, 2020 (KR) .................... 10-2020-0126346

(51) Int. Cl.
*H01L 29/20* (2006.01)
*H01L 23/544* (2006.01)
*H01L 25/075* (2006.01)
*H01L 33/00* (2010.01)
*H10D 86/40* (2025.01)
(Continued)

(52) U.S. Cl.
CPC ........ *H01L 25/0753* (2013.01); *H01L 23/544* (2013.01); *H10D 86/40* (2025.01); *H10D 86/60* (2025.01); *H10H 20/851* (2025.01); *H10H 20/855* (2025.01); *H10H 20/857* (2025.01);
(Continued)

(58) Field of Classification Search
CPC ............. H01L 25/0753; H01L 23/544; H01L 27/1214; H01L 33/50; H01L 33/58; H01L 33/62; H01L 2223/54426; H01L 2933/0091; H01L 27/124; H01L 2223/54486; H01L 25/167; G09G 3/3233; G09G 2300/026; G09G 2300/0804; G09G 2320/0295; G06F 3/1446; H10K 59/18
See application file for complete search history.

(56) References Cited

U.S. PATENT DOCUMENTS 6,686,353 B1    2/2004   Shiota et al.
7,102,726 B2    9/2006   Byun et al.
(Continued)

FOREIGN PATENT DOCUMENTS

JP          9-127546         5/1997
KR    10-2004-0111454    12/2004
(Continued)

*Primary Examiner* — Ismail A Muse
(74) *Attorney, Agent, or Firm* — KILE PARK REED & HOUTTEMAN PLLC

(57) ABSTRACT

A tiled display device includes a first display device and a second display device, each of the first display and the second display including a display area and a non-display area. The first display device and the second display device are bonded to each other. The first display device includes an alignment key area and a lower electrode layer. The alignment key area performs an alignment key function when a process is performed on the tiled display device. The lower electrode layer includes a first lower electrode layer and a second lower electrode layer. The first lower electrode layer surrounds the display area of the first display device and the second lower electrode layer is disposed in the alignment key area.

18 Claims, 12 Drawing Sheets

(51) Int. Cl.
*H10D 86/60* (2025.01)
*H10H 20/851* (2025.01)
*H10H 20/855* (2025.01)
*H10H 20/857* (2025.01)
*H10H 20/80* (2025.01)

(52) U.S. Cl.
CPC .. *H01L 2223/54426* (2013.01); *H10H 20/882* (2025.01)

(56) References Cited

U.S. PATENT DOCUMENTS

| | | | |
|---|---|---|---|
| 10,650,746 | B2* | 5/2020 | Kim .................... G09G 3/3258 |
| 10,653,021 | B2 | 5/2020 | Kim et al. |
| 10,962,850 | B1* | 3/2021 | Yang ................ G02F 1/136209 |
| 2005/0256230 | A1 | 11/2005 | Yamaguchi et al. |
| 2016/0020264 | A1* | 1/2016 | Choo .................. H01L 27/1225 257/40 |
| 2016/0284775 | A1* | 9/2016 | Lee ........................ H10K 50/80 |
| 2017/0069699 | A1* | 3/2017 | Kim ...................... H10K 59/131 |
| 2017/0146834 | A1* | 5/2017 | Tak ....................... G02F 1/1339 |
| 2017/0227809 | A1* | 8/2017 | Sato ................. G02F 1/133606 |
| 2019/0287231 | A1* | 9/2019 | Lee ....................... G01N 21/93 |
| 2021/0202685 | A1* | 7/2021 | Ban ...................... H10K 59/131 |
| 2021/0311606 | A1* | 10/2021 | Kono ...................... G09F 9/00 |
| 2022/0149134 | A1* | 5/2022 | Youn .................. H10K 59/1216 |
| 2022/0390795 | A1* | 12/2022 | Zhao ................ G02F 1/133617 |

FOREIGN PATENT DOCUMENTS

| | | |
|---|---|---|
| KR | 10-0487692 | 11/2005 |
| KR | 10-0740906 | 7/2007 |
| KR | 10-1157425 | 6/2012 |
| KR | 10-1895522 | 10/2018 |

* cited by examiner

TILED DISPLAY DEVICE

CROSS-REFERENCE TO RELATED APPLICATION(S)

This application claims priority to and benefits of Korean patent application 10-2020-0126346 under 35 U.S.C. § 119, filed on Sep. 28, 2020 in the Korean Intellectual Property Office, the entire contents of which are incorporated herein by reference.

BACKGROUND

1. Technical Field

This disclosure generally relates to a tiled display device.

2. Description of the Related Art

Interest in information displays has increased and research and development of display devices has continued.

SUMMARY

Embodiments provide a tiled display device having a structure for performing an alignment key function when a manufacturing process is performed.

In accordance with an aspect of the disclosure, a tiled display device may include a first display device and a second display device, each of the first display device and the second display device including a display area and a non-display area. The first display device and the second display device may be bonded to each other. The first display device may include a lower electrode layer and an alignment key area. The alignment key area may perform an alignment key function when a process is performed on the tiled display device. The lower electrode layer may include a first lower electrode layer and a second lower electrode layer. The first lower electrode layer may surround the display area of the first display device. The second lower electrode layer may be disposed in the alignment key area.

The second lower electrode layer may perform the alignment key function.

The tiled display device may include a substrate; and a transistor located on the substrate. The lower electrode layer may include a third lower electrode layer that overlaps the transistor.

The first lower electrode layer, the second lower electrode layer, and the third lower electrode layer may include the same material.

The alignment key area may include a first alignment key area and a second alignment key area that does not overlap the first alignment key area in a plan view.

The first alignment key area may be disposed at a corner of the first display device. The second alignment key area may be disposed at another corner of the first display device.

The first lower electrode layer may extend in a first direction, and at least a portion of the second lower electrode layer may extend in a direction non-parallel to the first direction.

The first display device may include a plurality of pixels arranged in a matrix form. The plurality of pixels may include an edge pixel most adjacent to at least one of corners of the display area and an adjacent pixel adjacent to the edge pixel in a row direction. The second lower electrode layer may be disposed between the edge pixel and the adjacent pixel in the row direction.

The first display device may include a plurality of pixels arranged in a matrix form. The plurality of pixels may include an edge pixel most adjacent to at least one of corners of the display area and an adjacent pixel adjacent to the edge pixel in a column direction. The second lower electrode layer may be disposed between the edge pixel and the adjacent pixel in the column direction.

The second lower electrode layer may have a shape protruding from the first lower electrode layer.

The first display device may include a plurality of pixels arranged in a matrix form. The plurality of pixels may include an edge pixel most adjacent to at least one of corners of the display area. The second lower electrode layer may overlap the edge pixel along at least one of a row direction and a column direction.

The second lower electrode layer may be spaced apart from the first lower electrode layer in a plan view.

The first display device may include a plurality of pixels arranged in a matrix form. The plurality of pixels may include an edge pixel most adjacent to at least one of corners of the display area and an adjacent pixel adjacent to the edge pixel in a column direction. The second lower electrode layer may be disposed between the edge pixel and the adjacent pixel.

The first display device may include a plurality of pixels arranged in a matrix form. The plurality of pixels may include an edge pixel most adjacent to at least one of corners of the display area and an adjacent pixel adjacent to the edge pixel in a row direction. The second lower electrode layer may be disposed between the edge pixel and the adjacent pixel.

At least portion of the second lower electrode layer may extends from at least a portion of the first lower electrode layer.

The first display device may include a plurality of pixels arranged in a matrix form. The plurality of pixels may include an edge pixel most adjacent to at least one of corners of the display area and an adjacent pixel adjacent to the edge pixel in a row direction. The second lower electrode layer may be disposed between the edge pixel and the adjacent pixel.

The first lower electrode layer may have a first width, and the second lower electrode layer may have a second width. The second width may be smaller than the first width.

The first display device may include a plurality of pixels arranged in a matrix form. The plurality of pixels may include an edge pixel most adjacent to at least one of corners of the display area and an adjacent pixel adjacent to the edge pixel in a row direction. The second lower electrode layer may be disposed between the edge pixel and the adjacent pixel in the row direction.

The first display device may include a plurality of pixels arranged in a matrix form. The plurality of pixels may include an edge pixel most adjacent to at least one of corners of the display area and an adjacent pixel adjacent to the edge pixel in a column direction. The second lower electrode layer may be located between the edge pixel and the adjacent pixel in the column direction.

Each of the first display device and the second display device may be at least one of a triangular shape, a rectangular shape, a hexagonal shape, and a trigonal pyramid shape.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
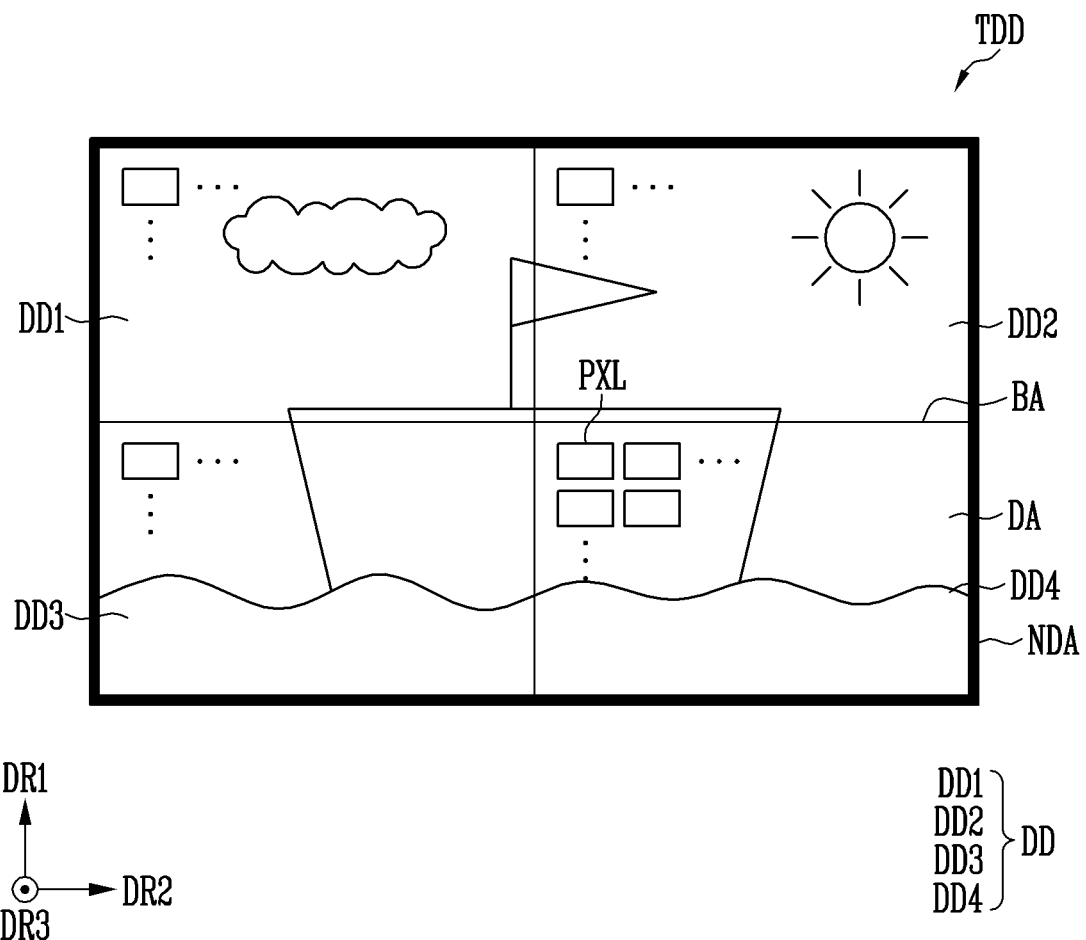
FIG. 1 is a schematic plan view illustrating a tiled display device in accordance with an embodiment.

The embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments disclosed in the specification are provided only for illustrative purposes and for full understanding of the scope of the disclosure by those skilled in the art. However, the disclosure is not limited to the embodiments, and it should be understood that the disclosure includes modification examples or change examples without departing from the spirit and scope of the disclosure.

The terms used in the specification have been selected as general terms currently widely used, if possible, considering the functions in the disclosure, but they may depend on the intentions of those skilled in the art, practice, the appearance of new technologies, etc. In addition, specific cases use the terms selected arbitrarily by the applicant and in these cases, their meaning will be described when describing corresponding disclosures. Thus, it should be noted that the terms used in the specification should be construed on the basis of their actual meanings and contents through the specification, not just names thereof.

The drawings attached to the specification are provided to easily explain the disclosure, and the shapes shown in the drawings may be exaggerated and displayed as necessary to help understanding of the disclosure, and thus the disclosure is not limited to the drawings.

In the specification, when it is determined that a detailed description of a known configuration or function related to the disclosure may obscure the gist of the disclosure, a detailed description thereof will be omitted as necessary.

The disclosure generally relates to a tiled display device.

Hereinafter, a tiled display device in accordance with the embodiments will be described with reference to FIGS. 1 to 12.

FIG. 1 is a plan view illustrating a tiled display device in accordance with an embodiment.

The tiled display device TDD may provide visual data to a user. The tiled display device TDD may output light along a third direction DR3, a normal direction to the plane formed by the directions DR1 and DR2.

The tiled display device TDD may be implemented by bonding display devices DD. The tiled display device TDD may display a large screen by bonding the display devices DD. Accordingly, the tiled display device TDD may be applied to a field in which a wide display surface is required, such as an outdoor billboard.

The display devices DD included in the tiled display device TDD may be implemented in various shapes. For example, the tiled display device TDD may be implemented as a rectangle type tiled display device in which each of the display devices DD has a rectangular shape. The tiled display device TDD may also be implemented as a multi-hexagon type tiled display device in which each of the display devices DD has a hexagonal shape or as a triangle type tiled display device in which each of the display devices DD has a triangular shape. The tiled display device TDD may be implemented as a trigonal pyramid type tiled display device in which the display devices have a trigonal pyramid shape of which at least a portion protrudes. However, the embodiments are not limited thereto, and the display devices DD may be implemented in various shapes. Hereinafter, for convenience of description, the display devices DD will be described to have a rectangular shape.

The display devices DD included in the tiled display device TDD may include first to fourth display devices DD1 to DD4. In an embodiment, the tiled display device TDD may include four display devices, but the number of display devices constituting the tiled display device TDD is not limited to a specific example. Hereinafter, for convenience of description, the tiled display device TDD will be described to include four display devices DD as shown in FIG. 1.

The tiled display device TDD may include a pixel PXL, a display area DA, a non-display area NDA, and a bonding area BA. Each of the display devices DD may include a display area DA and a non-display area NDA.

Light may be output in the display area DA. The pixel PXL may be disposed in the display area DA. The display area DA may be formed on one surface of the tiled display device TDD. However, the embodiments are not limited thereto, and the display area DA may be formed even on a side surface and/or a rear surface of the tiled display device TDD.

The pixels PXL may provide light. The pixels PXL may include a light emitting element LD (refer to FIG. 4). The light emitting element LD may emit light when electrical information is provided.

No light may be output in the non-display area NDA. The non-display area NDA is an area except the display area DA and the bonding area BA, and the pixel PXL may not be disposed in the non-display area NDA.

The bonding area BA may mean an area between the display devices DD included in the tiled display device TDD. The display devices DD may be bonded to each other with the bonding area BA interposed therebetween. For example, at least a portion of the bonding area BA may be disposed between the first display device DD1 and the second display device DD2.

Hereinafter, the display devices DD included in the tiled display device TDD in accordance with the embodiment will be described with reference to FIGS. 2 to 6. For convenience of description, any one of the display devices DD may be designated as a display device DD so as to describe a detailed configuration with respect to any one of the display devices DD.

Figure 2:
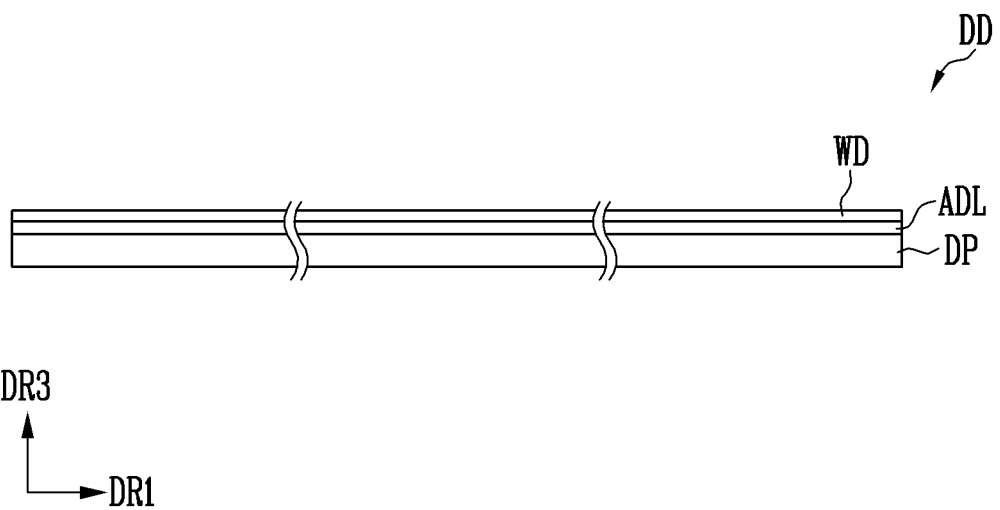
FIG. 2 is a schematic cross-sectional view illustrating a display device included in the tiled display device in accordance with an embodiment.

FIG. 2 is a schematic cross-sectional view illustrating a display device included in the tiled display device in accordance with an embodiment.

Referring to FIG. 2, the display device DD may include a display panel DP, an adhesive member ADL, and a window WD.

The display panel DP may include a pixel PXL providing light. The display panel DP may be implemented in various forms. For example, the display panel DP may be a self-luminescent display panel such as an Organic Light Emitting Display panel (OLED panel) using an organic light emitting diode as a light emitting element, a Nano-scale LED Display panel (Nano LED panel) using a nano-scale light emitting diode as a light emitting element, a Quantum Dot Organic Light Emitting Display panel (QD OLED panel) using an organic light emitting diode and a quantum dot, or a Quantum Dot Nano-scale LED Display panel (QD Nano LED panel) using a nano-scale light emitting diode and a quantum dot. However, the embodiments are not necessarily limited thereto, and the display panel DP may be implemented as a Liquid Crystal Display panel (LCD panel), an Electro-Phoretic Display panel (EPD panel), or an Electro-Wetting Display panel (EWD panel).

The window WD may be located on the display panel DP. The window WD and the display panel DP may be attached to each other by the adhesive member ADL. In an embodiment, the adhesive member ADL may include a resin, an optically clear adhesive, and/or a pressure sensitive adhesive, but the embodiments are not limited thereto. In some embodiments, the window WD may be integrally formed with the display panel DP. The window WD and the display panel DP may be manufactured in a single process.

The window WD may protect the display panel DP. The window WD may protect the display panel DP from external impacts and provide an input surface and/or a display surface to a user. The window WD may include various materials including glass or plastic and be configured in a single layer or a multi-layer.

Figure 3:
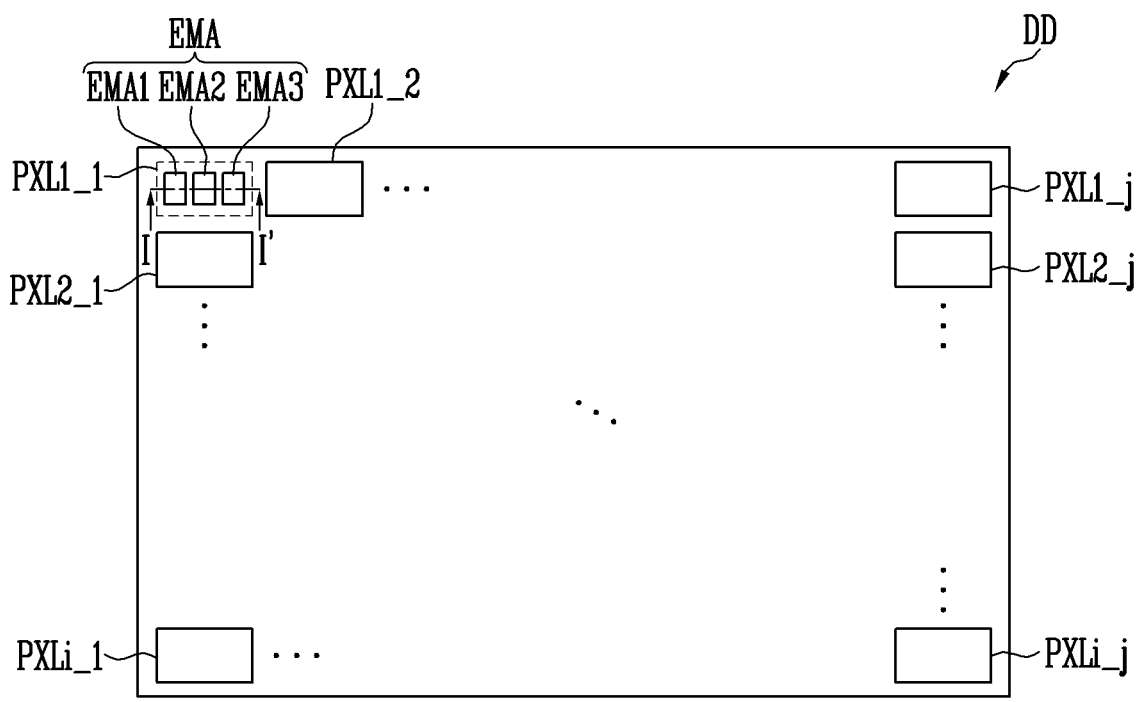
FIG. 3 is a schematic plan view illustrating a display device in accordance with an embodiment.
Figure 3:
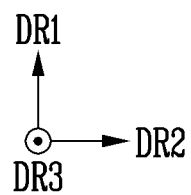

FIG. 3 is a plan view illustrating a display device in accordance with an embodiment.

Referring to FIG. 3, the pixels PXL may be referred to as pixels PXL1_1 to PXLi_j, based on the row and column. The pixels PXL1_1 to PXLi_j may be arranged in a matrix form. For example, a (1_1)th pixel PXL1_1 may be disposed on a first row and a first column, a (1_j) pixel PXL1_j may be disposed on the first row and a jth column, an (i_1) pixel PXLi_1 may be disposed on an ith row and the first column, and an (i_j)th pixel PXLi_j may be disposed on the ith row and the jth column.

The (1_1)th pixel PXL1_1 may be disposed in an area corresponding to a corner of the display device DD. The (1_j)th pixel PXL1_j may be disposed in an area corresponding to another corner of the display device DD. The (i_1)th pixel PXLi_1 may be disposed in an area corresponding to another corner of the display device DD. The (i_j)th pixel PXLi_j may be disposed in an area corresponding to another corner of the display device DD.

As described with reference to FIG. 1, the display devices DD may be bonded to each other with the bonding area BA interposed therebetween. Thus, at least one of the corner pixels, the (1_1)th pixel PXL1_1, the (1_j)th pixel PXL1_j, the (i_1)th pixel PXLi_1, and the (i_j)th pixel PXLi_j, of the display device DD may be adjacent to at least one of the corner pixels, the (1_1)th pixel PXL1_1, the (1_j)th pixel PXL1_j, the (i_1)th pixel PXLi_1, and the (i_j)th pixel PXLi_j, of an adjacent display device DD.

According to the tiled display device TDD in accordance with the embodiment, a configuration (or structure) capable of performing an alignment key function may be further included at a position corresponding to at least one of pixels PXL disposed most adjacent to the respective corners of the display device DD. For example, an additional structure (or configuration) may be further included at a position corresponding to at least one of (1_1)th pixel PXL1_1, the (1_j)th pixel PXL1_j, the (i_1)th pixel PXLi_1, and the (i_j)th pixel PXLi_j, as compared as the other pixels PXL. This will be described in detail below with reference to FIGS. 7 to 12.

Each of the pixels PXL may include emission areas EMA. The emission area EMA is defined as an area which allows light to be transmitted and then viewed by a user. The emission areas EMA may include a first emission area EMA1, a second emission area EMA2, and a third emission area EMA3. In an embodiment, light of different wavelengths may be emitted in the first to third emission areas EMA1 to EMA3 included in the pixel PXL. For example, the first emission area EMA1 may be an area in which red light is provided, the second emission area EMA2 may be an area in which green light is provided, and the third emission area EMA3 may be an area in which blue light is provided. However, the embodiments are not limited thereto, and each of the emission areas EMA1 to EMA3 may be an area in which light having any one color among cyan, magenta, and yellow is output.

Figure 4:
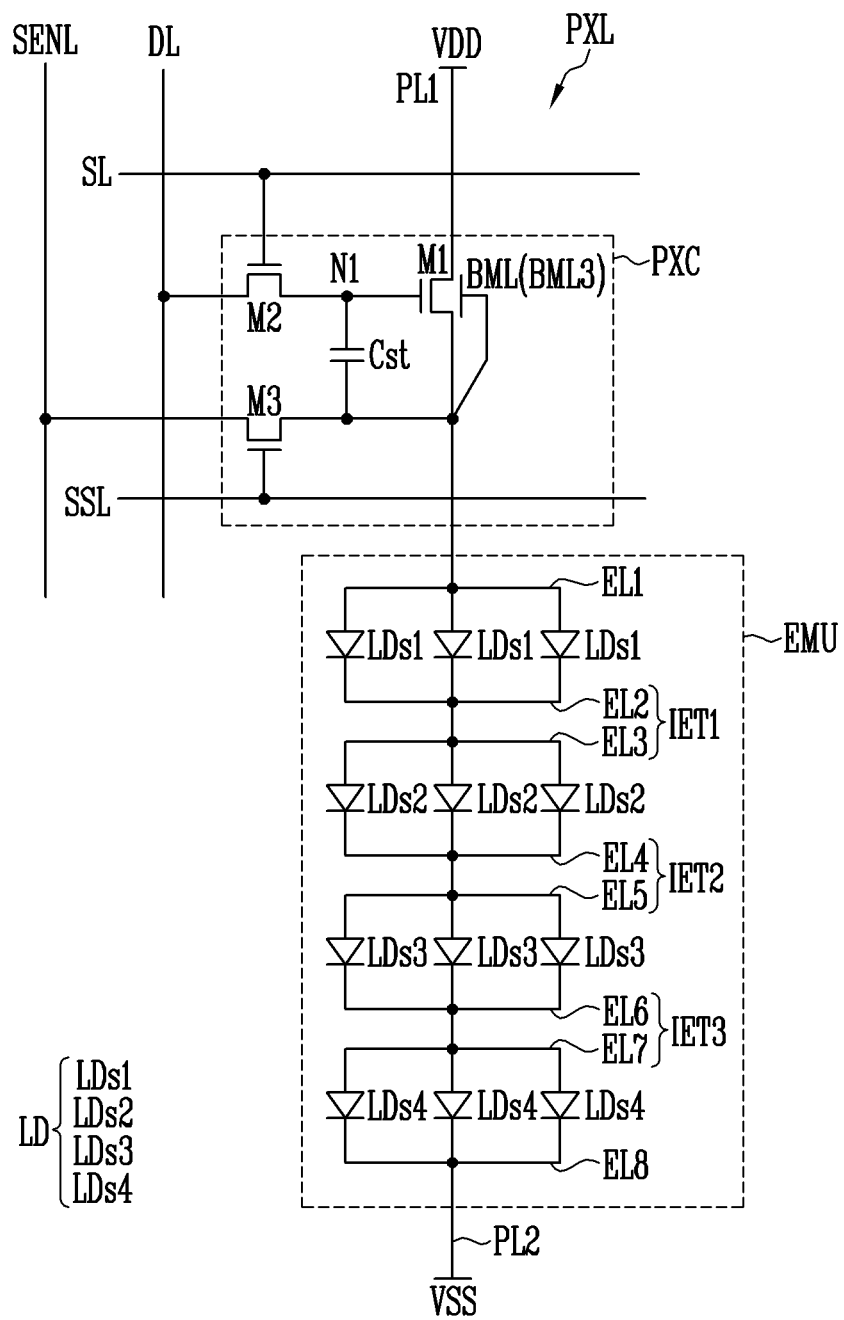
FIG. 4 is a view illustrating a schematic diagram of an equivalent circuit of a pixel in accordance with an embodiment.

FIG. 4 is a view illustrating a schematic diagram of an equivalent circuit of a pixel in accordance with an embodiment. For example, FIG. 4 is a schematic diagram of an equivalent circuit illustrating a pixel PXL included in the tiled display device TDD in accordance with an embodiment. For example, FIG. 4 illustrates an embodiment of a pixel PXL which may be applied to an active display device. However, the embodiments are not limited by the specific kinds of pixels PXL and display devices.

Referring to FIG. 4, the pixel PXL may include a light emitting unit EMU for generating light with a luminance corresponding to a data signal. The light emitting unit EMU may include a light emitting element LD. The light emitting element LD may include a first light emitting element LDs1, a second light emitting element LDs2, a third light emitting element LDs3, and a fourth light emitting element LDs4. A pixel circuit PXC may drive the light emitting unit EMU.

The light emitting unit EMU may include light emitting elements LD electrically connected between a first power source VDD and a second power source VSS. A first end portion (e.g., a P-type end portion) of each of the light emitting elements LD may be electrically connected to the first power source VDD via the pixel circuit PXC, a first power line PL1, and the like, and a second end portion (e.g., an N-type end portion) of each of the light emitting elements LD may be electrically connected to the second power source VSS via a second power line PL2 and the like.

In some embodiments, the light emitting elements LD may be electrically connected to each other through various connection structures between the first power source VDD and the second power source VSS. In an embodiment, the light emitting elements may be connected only in parallel to each other or be connected only in series to each other. The light emitting elements LD may also be connected in a series/parallel hybrid structure.

For example, the light emitting elements LD may be divided into four serial stages to be connected in series/parallel to each other as shown in FIG. 4. Each serial stage may include a pair of electrodes (e.g., two electrodes) and at least one light emitting element LD connected between the pair of electrodes. Numbers of light emitting elements LD constituting the respective serial stages may be equal to or different from each other, and the embodiments are not limited thereto.

For example, a first serial stage may include a first electrode EL1 a second electrode EL2, and at least one light emitting element LDs1 connected between the first and second electrodes EL1 and EL2, and a second serial stage may include a third electrode EL3, a fourth electrode EL4, and at least one light emitting element LDs2 connected between the third and fourth electrodes EL3 and EL4. Similarly, a third serial stage may include a fifth electrode EL5, a sixth electrode EL6, and at least one light emitting element LDs3 connected between the fifth and sixth electrodes EL5 and EL6, and a fourth serial stage may include a seventh electrode EL7, an eighth electrode EL8, and at least one light emitting element LDs4 connected between the seventh and eighth electrodes EL7 and EL8.

The first electrode EL1 may be a first pixel electrode (or anode electrode) of the light emitting unit EMU. The last electrode, e.g., the eighth electrode EL8 of the light emitting unit EMU may be a second pixel electrode (or cathode electrode) of the light emitting unit EMU.

Each of the second to seventh electrodes EL2 to EL7 may constitute an intermediate electrode. For example, the second electrode EL2 and the third electrode EL3 may be integrally or non-integrally connected to each other to constitute a first intermediate electrode IET1. Similarly, the fourth electrode EL4 and the fifth electrode EL5 may be integrally or non-integrally connected to each other to constitute a second intermediate electrode IET2, and the sixth electrode EL6 and the seventh electrode EL7 may be integrally or non-integrally connected to each other to constitute a third intermediate electrode IET3. The second and third electrodes EL2 and EL3 may be integrally considered as one first intermediate electrode IET1, the fourth and fifth electrodes EL4 and EL5 may be integrally considered as one second intermediate electrode IET2, and the sixth and seventh electrode EL6 and EL7 may be integrally considered as one third intermediate electrode IET3.

Although an embodiment in which the light emitting elements LD are connected in a four-stage series/parallel hybrid structure has been illustrated in FIG. 4, the embodiments are not limited thereto. For example, the light emitting elements LD may be connected in a two-stage series or series/parallel hybrid structure, or be connected in four or more series stages or series/parallel hybrid stages.

Although the light emitting elements LD are illustrated as connected in a series/parallel hybrid structure in FIG. 4, the embodiments are not limited thereto. For example, the light emitting elements LD provided in the light emitting unit EMU of each pixel PXL may be connected only in series or parallel.

Each of the light emitting elements LD may include a first end portion (e.g., a P-type end portion) connected to the first power source VDD via the first pixel electrode (e.g., the first electrode EL1), the pixel circuit PXC, and/or the first power line PL1, and a second end portion (e.g., an N-type end portion) connected to the second power source VSS via the second pixel electrode (e.g., the eighth electrode EL8) and the second power line PL2. For example, the light emitting elements LD may be connected in a forward direction between the first power source VDD and the second power source VSS. Each of the light emitting elements LD connected in the forward direction may form an effective light source, and the effective light sources may constitute the light emitting unit EMU of the pixel PXL.

The first power source VDD and the second power source VSS may have different potentials such that the light emitting elements LD may emit light. In an embodiment, the first power source VDD may be set as a high-potential power source, and the second power source VSS may be set as a low-potential power source. The first power source VDD and the second power source VSS may have a potential difference to a degree to which the light emitting elements LD may emit light during an emission period of the pixel PXL.

When a driving current is supplied through a corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU may express the luminance corresponding to the driving current.

In an embodiment, the light emitting unit EMU may further include at least one ineffective light source in addition to the light emitting elements LD forming the respective effective light sources. In an embodiment, at least one ineffective light emitting element which is arranged in a reverse direction or has at least one floated end portion may be further connected in one of the serial stages. The ineffective light emitting element may maintain a non-activated state even when a driving voltage (e.g., a forward driving voltage) is applied between the first and the second pixel electrodes. Accordingly, the ineffective light emitting element may substantially maintain a non-emission state.

The pixel circuit PXC may be connected between the first power source VDD and the light emitting unit EMU. The pixel circuit PXC may be connected to a scan line SL and a data line DL of a corresponding pixel PXL. The pixel circuit PXC may also be selectively connected to a sensing signal line SSL and a sensing line SENL.

The pixel circuit PXC may include a first transistor M1, a second transistor M2, a third transistor M3, and a storage capacitor Cst.

The first transistor M1 may be connected between the first power source VDD and the first electrode EL1 of the light emitting unit EMU. A gate electrode of the first transistor M1 may be connected to a first node N1. The first transistor M1 may control a driving current supplied to the light emitting unit EMU, corresponding to a voltage of the first node N1. For example, the first transistor M1 may be a driving transistor for controlling the driving current of the pixel PXL.

The first transistor M1 may also include a lower electrode layer BML connected to the first electrode EL1. At least a portion of the lower electrode layer BML may be disposed to overlap with the gate electrode GE (refer to FIG. 5) with an insulating layer interposed therebetween. The at least a portion of the lower electrode layer BML may be a third lower electrode layer BML3. The third lower electrode layer BML3 will be described in detail below with reference to FIGS. 8 to 12.

The second transistor M2 may be connected between the data line DL and the first node N1. A gate electrode of the second transistor M2 may be connected to the scan line SL. The second transistor M2 may be turned on when a scan signal having a gate-on voltage (e.g., a high-level voltage) is supplied from the scan line SL, to electrically connect the data line DL and the first node N1.

A data signal of a corresponding frame may be supplied to the data line DL for each frame period. The data signal may be transferred to the first node N1 through the turned-on second transistor M2 during a period in which the scan signal having the gate-on voltage is supplied. For example the second transistor M2 may be a switching transistor for transferring each data signal to the inside of the pixel PXL.

One electrode of the storage capacitor Cst may be connected to the first node N1, and the other electrode of the storage capacitor Cst may be connected to the first electrode EL1 of the light emitting unit EMU (or a second electrode of the first transistor M1). The storage capacitor Cst may charge a voltage corresponding to the data signal supplied to the first node N1 during each frame period.

The third transistor M3 may be connected between the first electrode EL1 of the light emitting unit EMU and the sensing line SENL. A gate electrode of the third transistor M3 may be connected to the sensing signal line SSL. The third transistor M3 may transfer a voltage value applied to the first electrode EL1 of the light emitting unit EMU (or a voltage value applied to an anode electrode of the light emitting element LD) to the sensing line SENL according to a sensing signal supplied to the sensing signal line SSL during a sensing period. The voltage value transferred through the sensing line SENL may be provided to an external circuit (e.g., a timing controller), the external circuit may extract characteristic information (e.g., a threshold voltage of the first transistor M1, etc.) of each pixel PXL, based on the provided voltage value. The extracted characteristic information may be used to convert input image data such that a characteristic deviation between the pixels PXL may be compensated.

Although the transistors, e.g., the first, second, and third transistors M1, M2, and M3 included in the pixel circuit PXC, are all illustrated as N-type transistors in FIG. 4, the embodiments are not limited thereto. For example, at least one of the first, second, and third transistors M1, M2, and M3 may be changed to a P-type transistor. In an embodiment, the pixel circuit PXC may include a combination of P-type and N-type transistors. For example, some of the transistors included in the pixel circuit PXC may be implemented with the P-type transistor, and the other may be implemented with the N-type transistor. The voltage level of a control signal (e.g., a scan signal, a data signal, and/or a sensing signal) for driving each transistor may be adjusted according to a type of the transistors.

The structure and driving method of the pixel PXL may be changed in some embodiments. For example, the pixel circuit PXC may be a pixel circuit having different structures and/or different driving methods from the example shown in FIG. 4.

In an embodiment, the pixel circuit PXC may not include the third transistor M3. Also, the pixel circuit PXC may further include additional circuit elements such as a transistor for compensating for the threshold voltage of the first transistor M1, etc., a transistor for initializing the voltage of the first node N1 or the first electrode EL1 of the light emitting unit EMU, a transistor for controlling a period in which a driving current is supplied to the light emitting unit EMU, and/or a boosting capacitor for boosting the voltage of the first node N1. In an embodiment, when each pixel PXL is provided in a passive light emitting element, etc., the pixel circuit PXC may be omitted.

Figure 5:
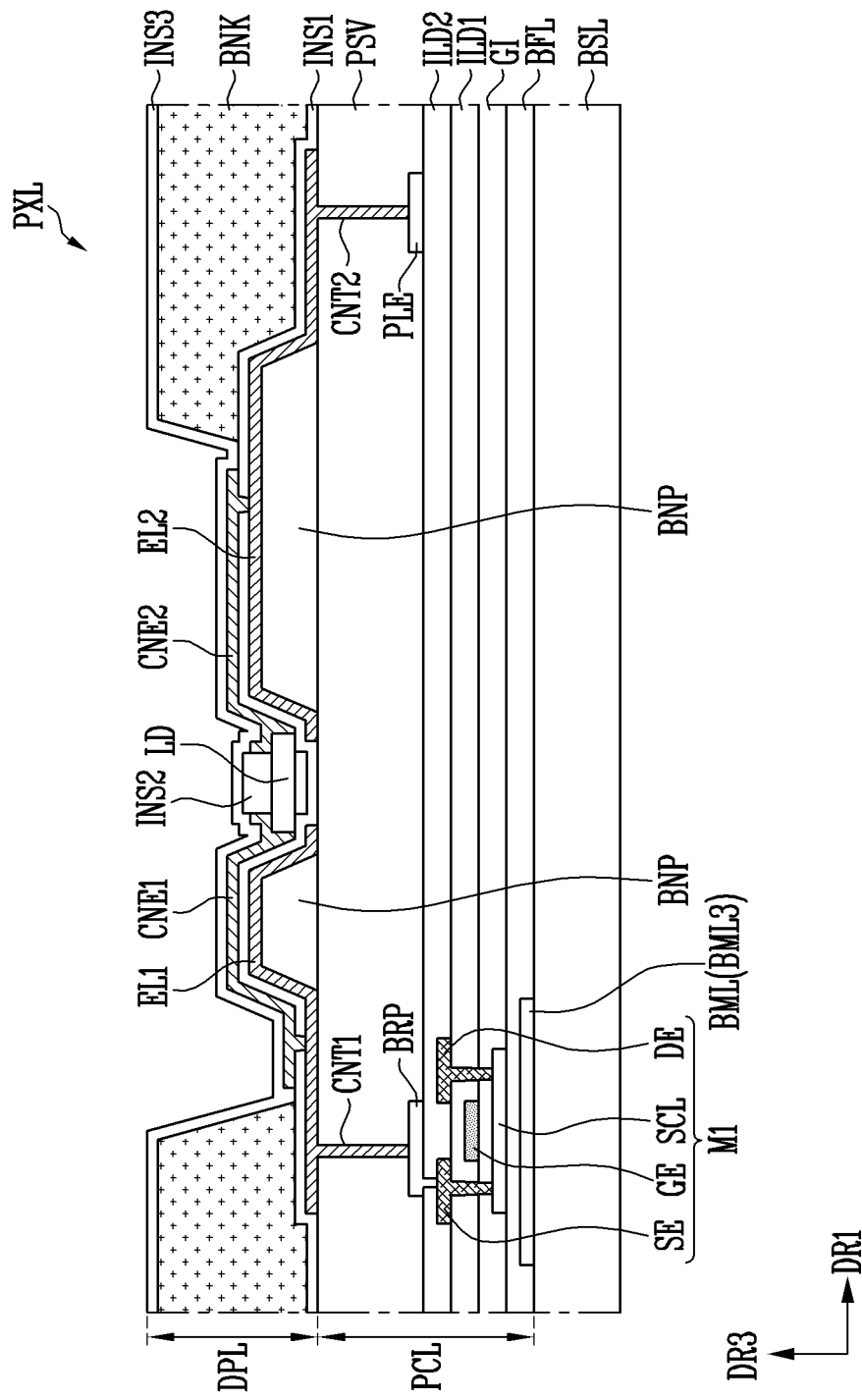
FIG. 5 is a schematic cross-sectional view illustrating a pixel included in the tiled display device in accordance with an embodiment.

FIG. 5 is a schematic cross-sectional view illustrating a pixel included in the tiled display device in accordance with an embodiment.

Referring to FIG. 5, the pixel PXL may include a base layer BSL, a pixel circuit layer PCL, and a display element layer DPL. In FIG. 5, for convenience of description, the pixel PXL will be described based on a configuration of a transistor corresponding to the first transistor M1 among the first to third transistors M1 to M3 shown in FIG. 4.

The base layer BSL may be a rigid or flexible substrate. In an embodiment, the base layer BSL may include a rigid material or a flexible material. In an embodiment, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the embodiments are not limited by the material of the base layer BSL.

The pixel circuit layer PCL may include a buffer layer BFL, a lower electrode BML, a first transistor M1, a gate insulating layer GI, a first interlayer insulating layer ILD1, a second interlayer insulating layer ILD2, a bridge pattern BRP, a power line PLE, a first contact part CNT1, a second contact part CNT2, and a protective layer PSV.

The buffer layer BFL may be located on the base layer BSL. The buffer layer BFL may prevent contamination by impurities from the outside. The buffer layer BFL may include at least one of silicon nitride (SiNx), silicon oxide (SiOx), silicon oxynitride (SiOxNy), and metal oxide such as aluminum oxide (AlOx).

At least a portion of the lower electrode layer BML may be located on the buffer layer BFL. At least a portion of the lower electrode layer BML may overlap with a gate electrode GE in a plan view. The lower electrode layer BML located on the buffer layer BFL may be a third lower electrode layer BML3.

At least another portion, for example, a first lower electrode layer BML1 (refer to FIG. 8) and/or a second lower electrode layer BML2 (refer to FIG. 8), of the lower electrode layer BML may be disposed at a portion of the display panel DP, at which the pixels PXL are not disposed. This will be described in detail below with reference to FIGS. 8 to 12.

In an embodiment, the first transistor M1 may be a driving transistor. The first transistor M1 may include a semiconductor layer SCL, the gate electrode GE, a source electrode SE, and a drain electrode DE.

The semiconductor layer SCL may be located on the buffer layer BFL. The semiconductor layer SCL may include at least one of poly-silicon, amorphous silicon, and an oxide semiconductor.

The semiconductor layer SCL may include a first contact region in contact with the source electrode SE and a second contact region in contact with the drain electrode DE.

The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate insulating layer GI may be provided over the semiconductor layer SCL. The gate insulating layer GI may include an inorganic material. In an embodiment, the gate insulating layer GI may include at least one of silicon nitride (SiNx), silicon oxide (SiOx), silicon oxynitride (SiOxNy), and aluminum oxide (AlOx). In some embodiments, the gate insulating layer GI may include an organic material.

The gate electrode GE may be located on the gate insulating layer GI. A position of the gate electrode GE may correspond to that of the channel region of the semiconductor layer SCL. For example, the gate electrode GE may be disposed on the channel region of the semiconductor layer SCL with the gate insulating layer GI interposed therebetween.

The first interlayer insulating layer ILD1 may be located over the gate electrode GE. Like the gate insulating layer GI, the first interlayer insulating layer ILD1 may include at least one of silicon nitride (SiNx), silicon oxide (SiOx), silicon oxynitride (SiOxNy), and aluminum oxide (AlOx).

The source electrode SE and the drain electrode DE may be located on the first interlayer insulating layer ILD1. The source electrode SE may be in contact with the first contact region of the semiconductor layer SCL while penetrating the gate insulating layer GI and the first interlayer insulating layer ILD1, and the drain electrode DE may be in contact with the second contact region of the semiconductor layer SCL while penetrating the gate insulating layer GI and the first interlayer insulating layer ILD1.

The second interlayer insulating layer ILD2 may be located over the source electrode SE and the drain electrode DE. Like the first interlayer insulating layer ILD1 and the gate insulating layer GI, the second interlayer insulating layer ILD2 may include an inorganic material. The inorganic material may include at least one of the materials constituting the first interlayer insulating layer ILD1 and the gate insulating layer GI, e.g., silicon nitride (SiNx), silicon oxide (SiOx), silicon oxynitride (SiOxNy), and aluminum oxide (AlOx). In some embodiments, the second interlayer insulating layer ILD2 may include an organic material.

The bridge pattern BRP may be located on the second interlayer insulating layer ILD2. The bridge pattern BRP may be electrically connected to the source electrode SE through a contact hole penetrating the second interlayer insulating layer ILD2.

The power line PLE may be disposed on the second interlayer insulating layer ILD2. The power line PLE may receive power applied from the second power source VSS described with reference to FIG. 4.

The protective layer PSV may be located on the second interlayer insulating layer ILD2. The protective layer PSV may cover the bridge pattern BRP and the power line PLE.

The protective layer PSV may be provided in a form including an organic insulating layer, an inorganic insulating layer, or the organic insulating layer disposed on the inorganic insulating layer.

The protective layer PSV may include the first contact part CNT1 electrically connected to one region of the bridge pattern BRP and the second contact part CNT2 electrically connected to one region of the power line PLE.

The display element layer DPL may include a bank pattern BNP, a first electrode EL1, a second electrode EL2, a first insulating layer INS1, a light emitting element LD, a first contact electrode CNE1, a second contact electrode CNE2, a second insulating layer INS2, a bank BNK, and a third insulating layer INS3.

The bank pattern BNP may have a shape protruding upwardly, and the first electrode EL1 and the second electrode EL2 may be disposed on the bank pattern BNP, to form a reflective partition wall. The reflective partition wall is formed, so that the light efficiency of the light emitting element LD may be improved.

The first electrode EL1 may be disposed on the protective layer PSV. The first electrode EL1 may be a path through which a voltage of the first power source VDD described with reference to FIG. 4 may be applied, and may be a path through which electrical information on the light emitting element LD may be provided.

The second electrode EL2 may be disposed on the protective layer. The second electrode E12 may be a path through which a voltage of the second power source VSS described with reference to FIG. 4 may be applied.

The first electrode EL1 and the second electrode EL2 may reflect light emitted from the light emitting element LD in a display direction such that the light emission efficiency of the light emitting element LD is improved. The display direction may be the third direction DR3.

The first insulating layer INS1 may be located on the protective layer PSV. Like the second interlayer insulating layer ILD2, the first insulating layer INS1 may include at least one of silicon nitride (SiNx), silicon oxide (SiOx), silicon oxynitride (SiOxNy), and aluminum oxide (AlOx).

At least a portion of the first insulating layer INS1 may be disposed on the first contact electrode CNE1, the second contact electrode CNE2, the first electrode EL1, and/or the second electrode EL2, to stabilize electrical connection and to reduce external influences.

The light emitting element LD may be located on the first insulating layer INS1. In an embodiment, the first insulating layer INS1 may have a groove, at least a portion of the light emitting element LD may be in contact with an end portion formed from the groove, and another end portion of the light emitting element LD may be in contact with another end portion formed due to the groove.

The light emitting element LD may be located on the first insulating layer INS1 between the first electrode EL1 and the second electrode EL2. The light emitting element LD may be an element including an inorganic material having a nano or micro scale.

The light emitting element LD may include a first semiconductor layer, a second semiconductor layer, an active layer, and an insulating layer. The first semiconductor layer may include a semiconductor layer having a different type from that of the second semiconductor layer. In an embodiment, the first semiconductor layer may include an N-type semiconductor layer, and the second semiconductor layer may include a P-type semiconductor layer.

The first semiconductor layer and the second semiconductor layer may include at least one semiconductor material among InAlGaN, GaN, AlGaN, InGaN, AlN, and InN.

The active layer may be located between the first semiconductor layer and the second semiconductor layer. The active layer may include a single or multiple quantum well structure.

When an electric field having a predetermined voltage or higher is applied to both ends of the light emitting element LD, light may be emitted while electron-hole pairs are combined in the active layer.

The second insulating layer INS2 may be located on the light emitting element LD. The second insulating layer INS2 may be formed to cover a region corresponding to the active layer of the light emitting element LD. The second insulating layer INS2 may include at least one of an organic material and an inorganic material.

In some embodiments, at least a portion of the second insulating layer INS2 may be located on a rear surface of the light emitting element LD. The second insulating layer INS2 formed on the rear surface of the light emitting element LD may fill an empty gap between the first insulating layer INS1 and the light emitting element LD in a process of forming the second insulating layer INS2 on the light emitting element LD.

The first contact electrode CNE1 and the second contact electrode CNE2 may be located on the first insulating layer INS1. The first contact electrode CNE1 and the second contact electrode CNE2 may be electrically connected respectively to the first electrode EL1 and the second electrode EL2 through a contact hole formed in the first insulating layer INS1.

The first contact electrode CNE1 and the second contact electrode CNE2 may include at least one of conductive materials including Indium Tin Oxide (ITO), Indium Zinc Oxide (IZO), and Indium Tin Zinc Oxide (ITZO).

An electrical signal provided through the first electrode EL1 may be provided to the light emitting element LD through the first contact electrode CNE1. The light emitting element LD may emit light, based on the provided electrical signal.

An electrical signal provided through the second electrode EL2 may be provided to the light emitting element LD through the second contact electrode CNE2.

The bank BNK may be a structure defining an emission area EMA of the pixel PXL. The emission area EMA may mean an area in which light is emitted from the light emitting element LD. For example, the bank BNK may be disposed in a boundary area between adjacent light emitting elements LD to surround the light emitting element LD of the pixel PXL.

The third insulating layer INS3 may be disposed on the bank BNK, the first contact electrode CNE1, the second contact electrode CNE2, and the second insulating layer INS2. The third insulating layer INS3 may include any one of an organic material and an inorganic material. The third insulating layer INS3 may protect the display element layer DPL from external influences.

The embodiments are not limited to the arrangement relationship of the light emitting element LD, the electrodes, and the like described with reference to FIG. 5, and other arrangement relationships in accordance with various modifiable embodiments may be implemented.

Hereinafter, a filling layer 510, a light control layer LCP, and an upper substrate UPL will be described with reference to FIG. 6. However, convenience of description, detailed structures and overlapping descriptions of the pixel circuit layer PCL and the display element layer DPL will be omitted, and a structure including the light control layer LCP will be described in detail.

Figure 6:
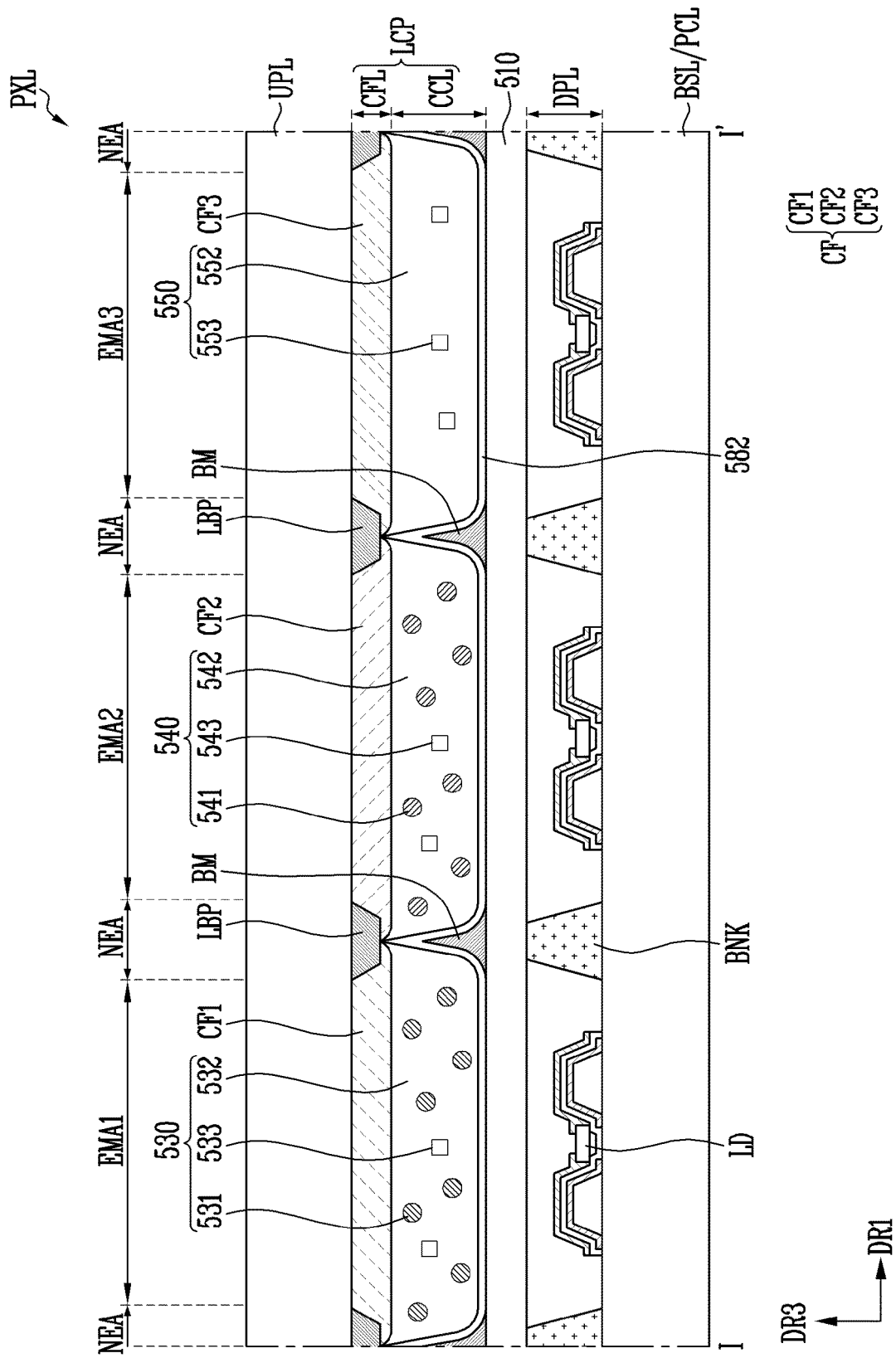
FIG. 6 is a schematic cross-sectional view taken along line I-I' shown in FIG. 3.

FIG. 6 is a schematic cross-sectional view taken along line I-I' shown in FIG. 3.

Referring to FIG. 6, the filling layer 510 may be located on the display element layer DPL. The filling layer 510 may include epoxy, urethane acrylate, epoxy acrylate or silicon series (e.g., bisphenol A-type epoxy, cycloaliphatic epoxy resin, phenyl silicon resin or rubber, aliphatic urethane acrylate, and the like) resin. The filling layer 510 may also include a material selected from the group consisting of hexamethyldisiloxane, octamethyltrisiloxane, decamethyltetrasiloxane, dodecamethylpentasiloxane, and polydimethylsiloxane. However, the embodiments are not limited by the material included in the filling layer 510 and other filling materials may be included.

The light control layer LCP may be located on the filling layer 510. However, in some embodiments, when the filling layer 510 is not provided, the light control layer LCP may be located on the display element layer DPL, or at least a portion of the light control layer LCP may overlap with a layer in which the display element layer DPL is located. The light control layer LCP may include a color conversion layer CCL and a color filter layer CFL.

The color conversion layer CCL may include a black matrix BM, wavelength conversion patterns 530 and 540, and a light transmission pattern 550. The wavelength conversion patterns 530 and 540 may include a first wavelength conversion pattern 530 and a second wavelength conversion pattern 540.

The black matrix BM may be located between the color filter layer CFL and the display element layer DPL in a non-emission area NEA. The non-emission area NEA may be provided in a shape surrounding an emission area EMA, and be defined as an area in which no light is emitted. For example, an area in which the black matrix BM is disposed may correspond to the non-emission area NEA in which no light is emitted. The black matrix BM may include a light blocking material and/or a reflective material.

The first wavelength conversion pattern 530 may be located in a first emission area EMA1 in a plan view. The first wavelength conversion pattern 530 may include a first wavelength conversion material 531, a first base resin 532, and a first scattering material 533. The first wavelength conversion material 531 may convert a peak wavelength of incident light. In an embodiment, the first wavelength conversion material 531 may convert blue light into red light having a wavelength of about 610 nm to about 650 nm. The first wavelength conversion material 531 may be a quantum dot (QD), a quantum rod, or a fluorescent substance.

The quantum dot may mean a particle material which emits light having a specific wavelength, while electrons are transferred from a conduction band to a valence band. The quantum dots may be semiconductor nanocrystalline materials. The quantum dots have a specific band gap depending on their composition and size, and may emit light having an inherent band after absorbing light. Examples of the semiconductor nanocrystals of the quantum dots may include a Group IV based nanocrystal, a Group II-VI based compound nanocrystal, a Group III-V based compound nanocrystal, a Group IV-VI based nanocrystal, or a combination thereof.

The first base resin 532 may have high light transmittance and have excellent dispersion characteristic with respect to the first wavelength conversion material 531. For example, the first base resin 532 may include an organic material such as epoxy-based resin, acryl-based resin, cardo-based resin, or imide-based resin.

The first scattering material 533 may have a refractive index different from that of the first base resin 532 and form an optical interface with the first base resin 532. The first scattering material 533 may be a light scattering particle. In an embodiment, the first scattering material 533 may be a metal oxide particle or an organic particle.

The second wavelength conversion pattern 540 may be located in a second emission area EMA2 in a plan view. The second wavelength conversion pattern 540 may include a second wavelength conversion material 541, a second base resin 542, and a second scattering material 543.

The second wavelength conversion material 541 may convert a peak wavelength of incident light. In an embodiment, the second wavelength conversion material 541 may convert blue light into green light having a wavelength of about 510 nm to about 550 nm.

The second wavelength conversion material 541 may be a quantum dot (QD), a quantum rod, or a fluorescent substance.

The second base resin 542 may have high light transmittance and have excellent dispersion characteristic with respect to the second wavelength conversion material 541. For example, like the first base resin 532, the second base resin 542 may include an organic material such as epoxy-based resin, acryl-based resin, cardo-based resin, or imide-based resin.

The second scattering material 543 may have a refractive index different from that of the second base resin 542 and form an optical interface with the second base resin 542. The second scattering material 543 may be a light scattering particle.

The light transmission pattern 550 may be located in a third emission area EMA3 in a plan view. The first light transmission pattern 550 may include a third base resin 552 and a third scattering material 553.

The third base resin 552 may have high light transmittance and have excellent dispersion characteristic with respect to the third scattering material 553. For example, like the first base resin 532, the third base resin 552 may include an organic material such as epoxy-based resin, acryl-based resin, cardo-based resin, or imide-based resin.

The third scattering material 553 may have a refractive index different from that of the third base resin 552 and form an optical interface with the third base resin 552. The third scattering material 553 may be a light scattering particle.

A capping layer 582 along with a color filter CF may seal the first wavelength conversion pattern 530, the second wavelength conversion pattern 540, and the light transmission pattern 550, and accordingly, may prevent the first wavelength conversion pattern 530, the second wavelength conversion pattern 540, and the light transmission pattern 550 from being damaged or contaminated due to penetration of a foreign matter such as moisture or air from the outside. The capping layer 582 may include at least one of an inorganic material and an organic material.

The color filter layer CFL may include a light blocking pattern LBP and color filters CF. The color filters may include a first color filter CF1, a second color filter CF2, and a third color filter CF3.

The light blocking pattern LBP may be located in the non-emission area NEA. The light blocking pattern LBP may be disposed along a boundary of the emission area EMA, and block light transmission. The light blocking pattern LBP may include light blocking material. In an embodiment, the light blocking pattern LBP may be made of the same material as the black matrix BM, but the embodiments are not limited thereto.

Any one of the color filters CF may allow light having a specific wavelength to be selectively transmitted, and may absorb light having a wavelength different from the specific wavelength. Light passing through the color filter CF may display one of three primary colors of red, green, and blue. However, a display color of light passing through the color filter CF is not limited to the primary colors, and the light passing through the color filter CF may display any one of cyan, magenta, yellow, and a white-based color.

The first color filter CF1 may be disposed in the first emission area EMA1. The first color filter CF1 may allow light of a first color to be transmitted, and may absorb light of a second color and light of a third color. The first color filter CF1 may include a colorant of the first color. The second color filter CF2 may be disposed in the second emission area EMA2. The second color filter CF2 may allow light of the second color to be transmitted, and may absorb light of the first color and light of the third color. The second color filter CF2 may include a colorant of the second color. The third color filter CF3 may be disposed in the third emission area EMA3. The third color filter CF3 may allow light of the third color to be transmitted, and may absorb light of the first color and light of the second color. The third color filter CF3 may include a colorant of the third color.

The upper substrate UPL may be disposed on the light control layer LCP. The upper substrate UPL may include a material having a light transmissivity. The upper substrate UPL may be a rigid substrate or a flexible substrate. In an embodiment, the upper substrate UPL may be a window member or an encapsulation substrate.

Hereinafter, structural features of display devices DD included in a tiled display device TDD in accordance with an embodiment will be described with reference to FIGS. 7 to 12.

Figure 7:
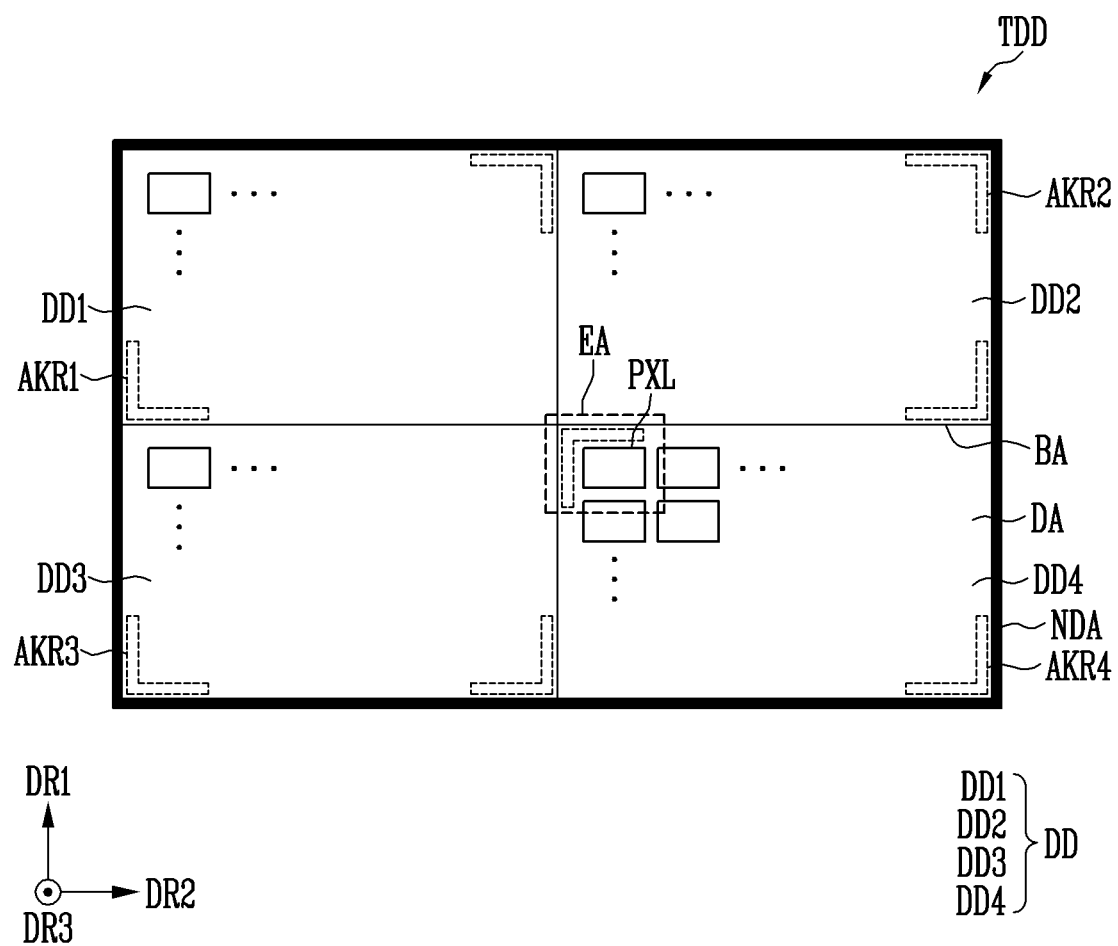
FIG. 7 is a schematic plan view illustrating a tiled display device in accordance with an embodiment.

FIG. 7 is a plan view illustrating a tiled display device in accordance with an embodiment. FIGS. 8 to 12 are enlarged views of area EA shown in FIG. 7.

When processes are performed on the tiled display device DD, may be is necessary to define the positions of display devices DD1 to DD4. For example, when a photolithography process for forming the pixel circuit layer PCL is performed on display devices DD, each of the display devices DD may be aligned according to a predetermined reference. In another example, when an optical performance inspection on the display devices DD is performed, each of the display devices DD may be aligned at a specific position.

To perform such alignment, each of the display devices DD included in the tiled display device TDD in accordance with the embodiment may be distinguished from another of the display devices DD. For example, a first display device DD1 may further include at least a structure different from those of second to fourth display devices DD2 to DD4. The fourth display device DD4 may further include at least a structure different from those of the first to third display devices DD1 to DD3.

The tiled display device TDD may include an alignment key area AKR. The alignment key area AKR may mean an area in which an alignment key function may be performed when a process on the tiled display device TDD is performed. The alignment key area AKR may mean an area provided with a structure (or configuration) capable of performing an alignment key function for distinguishing the display devices DD from each other.

For example, at least a portion of a lower electrode layer BML may be disposed in the alignment key area AKR. The portion of the lower electrode layer BML, which is disposed in the alignment key area AKR, may perform an alignment key function when a process is performed on the tiled display device TDD.

The lower electrode layer BML may include a first lower electrode layer BML1, a second lower electrode layer BML2, and a third lower electrode layer BML3. The first lower electrode layer BML1 may have a shape that surrounds the display area DA of each of the display devices DD, the second lower electrode layer BML2 may be disposed in the alignment area AKR, and the third lower electrode layer BML3 may overlap with a semiconductor layer SCL in the display area DA. The second lower electrode layer BML2 may perform an alignment key function when a process is performed on the tiled display device TDD. The first lower electrode layer BML1, the second lower electrode layer BML2, and the third lower electrode layer BML3 may be formed in a single process, and may be comprised of the same material.

The alignment key area AKR may include first to fourth alignment key area AKR1 to AKR4. The first to fourth alignment key area AKR1 to AKR4 may respectively correspond to the display devices DD. For example, the first display device DD1 may include the first alignment key area AKR1. The second display device DD2 may include the second alignment key area AKR2. The third display device DD3 may include the third alignment key area AKR3. The fourth display device DD4 may include the fourth alignment key area AKR4.

When a process (e.g., an optical performance inspection process, a photolithography process, or the like) is performed, each of the display devices DD may be arranged in specific positions with respect to the alignment key area AKR. For example, whether the fourth display device DD4 has been properly aligned may be determined based on whether the fourth alignment key area AKR4 corresponds to a predetermined area.

The alignment key area AKR may be located adjacent to a corner of each of the display devices DD. The alignment key area AKR may be disposed adjacent to at least one of corner areas of each of the display devices DD. At least a portion of the alignment key area AKR may be disposed between the display area DA and a non-display area NDA. At least a portion of the alignment key area AKR may be formed along an outer portion of each of the display devices DD.

In an embodiment, the alignment key area AKR may include at least two areas that do not overlap with each other on each of the display devices DD. For example, the first alignment key area AKR1 may be disposed in each of the corner areas adjacent to the (1_j)th pixel PXL1_j and the (i_1)th pixel PXLi_1 of the first display device DD1. The second alignment key area AKR2 may be disposed in each of the corner areas adjacent to the (1_j)th pixel PXL1_j and the (i_j)th pixel PXLi_j of the second display device DD2. The third alignment key area AKR3 may be disposed in each of the corner areas adjacent to the (i_1)th pixel PXLi_1 and the (i_j)th pixel PXLi_j of the third display device DD3. The fourth alignment key area AKR4 may be disposed in each of a corner area adjacent to a (1_1)th pixel PXL1_1 of the fourth display device DD4 and a corner area adjacent to an (i_j)th pixel PXLi_j of the fourth display device DD4.

However, the embodiments are not limited to the number and positions of alignment key areas AKR in the above-described example, and the alignment key areas AKR may be located in a single area of a display device DD or be located at all of the corners of the display devices DD.

Hereinafter, the alignment key area AKR included in the tiled display device TDD in accordance with the embodiment will be described in detail with reference to FIGS. 8 to 12. For convenience of description, the alignment key area AKR will be described with respect to the fourth display device DD4.

Referring to FIGS. 8 to 12, the first lower electrode layer BML1 may be formed along an outer portion of each display device DD. The lower electrode layer BML may be provided in a shape surrounding the display area of the display device DD. The second lower electrode BML2 may perform an alignment key function. The second lower electrode layer BML2 may include a part that performs the alignment key function.

Figure 8:
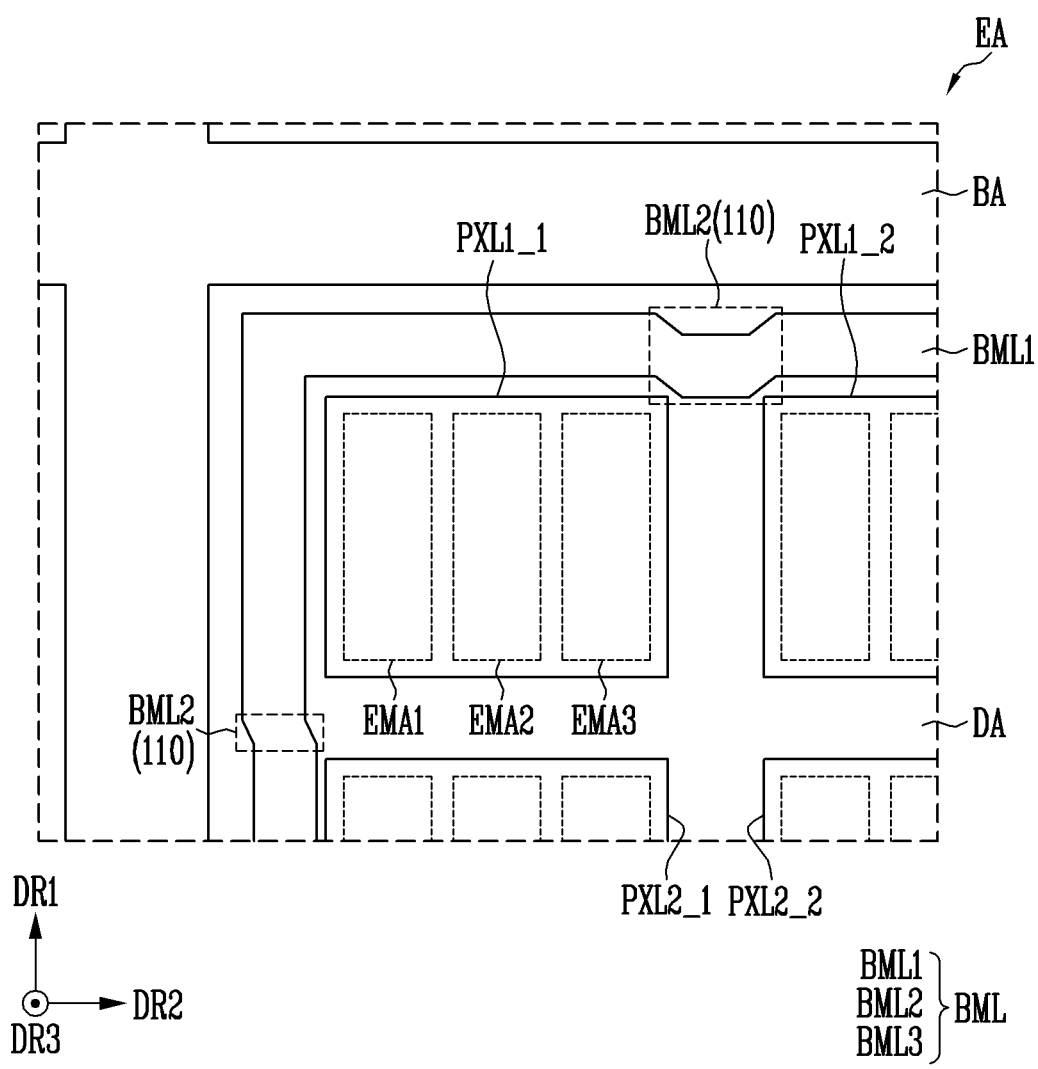
FIGS. 8 to 12 are enlarged schematic views of area EA shown in FIG. 7.

Referring to FIG. 8, the second lower electrode layer BML2 may have a bent shape. The first lower electrode layer BML1 may extend in a predetermined direction, and at least a portion of the second lower electrode layer BML2 may extend in a direction non-parallel to the predetermined direction. The second lower electrode BML2 may be a bending part 110. The bending part 100 may perform an alignment key function. The bending part 110 may be included in the fourth alignment key area AKR4 in a plan view.

The bending part 110 may be adjacent to one corner area of the fourth display device DD4. For example, the bending part 110 may be adjacent to the (1_1)th pixel PXL1_1.

The fourth display device DD4 may include an edge pixel that is most adjacent to a corner of the display area DA of the fourth display device DD4 and an adjacent pixel that is adjacent to the edge pixel a row direction (e.g., a second direction DR2) or a column direction (e.g., a first direction DR1). The bending part 110 may be disposed between the edge pixel and the adjacent pixel with respect to the row direction or the column direction. For example, the bending part 110 may be disposed between the (1_1)th pixel PXL1_1 and a (1_2) pixel PXL1_2 with respect to the second direction DR2. The bending part 110 may also be disposed between the (1_1)th pixel PXL1_1 and a (2_1) pixel PXL2_1 with respect to the first direction DR1.

The second lower electrode layer BML2 may be considered as one corner of the fourth display device DD4 from the outside. The position of the bending part 110 corresponds to the (1_1)th pixel PXL1_1 adjacent to the corner of the fourth display device DD4, so that the alignment position of the fourth display device DD4 may be clearly determined.

Figure 9:
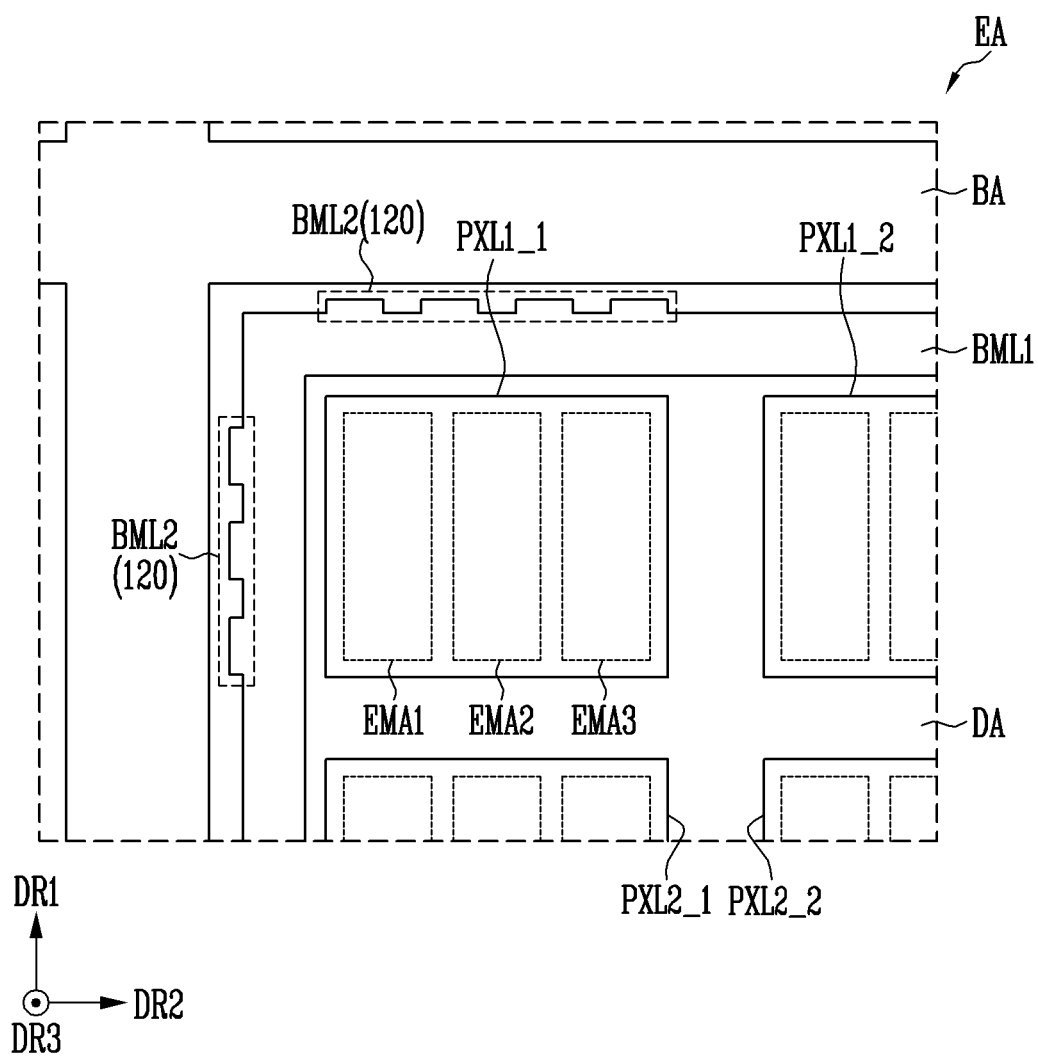

Referring to FIG. 9, the second lower electrode layer BML2 may have a protruding shape. The second lower electrode layer BML2 may be a protrusion part 120. The protrusion part 120 may perform an alignment key function. The protrusion part 120 may be included in the fourth alignment key area AKR4 in a plan view.

The protrusion part 120 may be adjacent to a corner area of the fourth display device DD4. For example, the protrusion part 120 may be disposed adjacent to the (1_1)th pixel PXL1_1.

The fourth display device DD4 may include an edge pixel most adjacent to one corner of the display area DA, and the protrusion part 120 may overlap with the edge pixel along at least one of a row direction (e.g., the second direction DR2) and a column direction (e.g., the first direction DR1). For example, the protrusion part 120 may be disposed in parallel to the (1_1)th pixel PXL1_1 with respect to the second direction DR2. The protrusion part 120 may also be disposed in parallel to the (1_1)th pixel PXL1_1 with respect to the first direction DR1.

Although the protrusion part 120 is illustrated to face an outer portion of the first lower electrode BML1 from the area in which the pixel PXL is disposed in FIG. 9, the embodiments are not limited thereto, and at least a portion of the protrusion part 120 may be formed to face the area in which the pixel PXL is disposed from the first lower electrode layer BML1.

The protrusion part 120 may be considered as one corner area of the fourth display device DD4 from the outside. The protrusion part 120 is adjacent to the (1_1)th pixel PXL1_1 adjacent to a corner of the fourth display device DD4, so that the alignment position of the fourth display device DD4 may be clearly determined.

Figure 10:
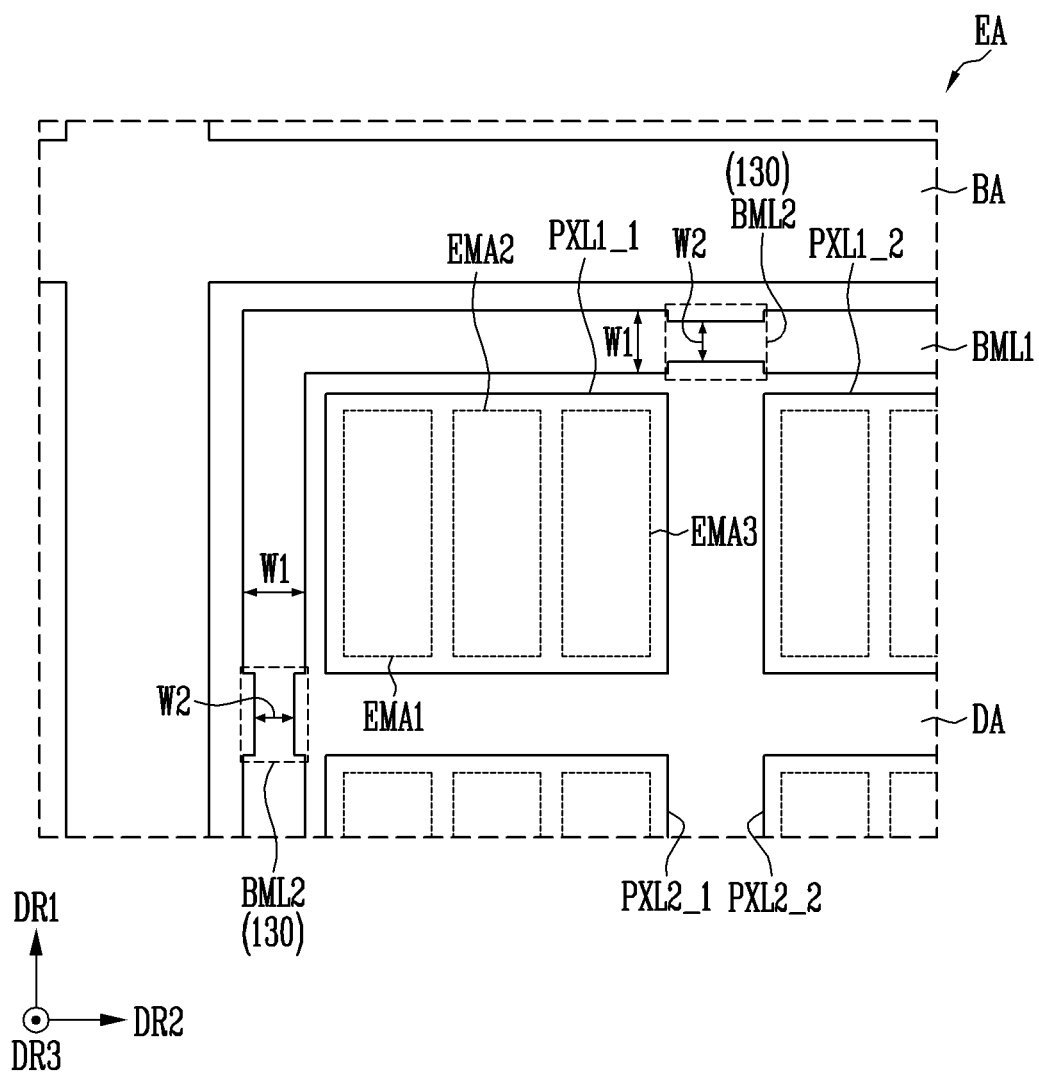

Referring to FIG. 10, a width of the second lower electrode layer BML2 may be thinner than that of the first lower electrode layer BML1. The first lower electrode layer BML1 may have a first width W1, the second lower electrode layer BML2 may have a second width W2, and the second width W2 may have a value smaller than that of the first width W1. The second lower electrode layer BML2 may be a narrow part 130. The narrow part 130 may perform an alignment key function. The narrow part 130 may be included in the fourth alignment key area AKR4 in a plan view.

The narrow part 130 may be adjacent to a corner area of the fourth display device DD4. For example, the narrow part 130 may be disposed adjacent to the (1_1)th pixel PXL1_1 of the fourth display device DD4.

The fourth display device DD4 may include an edge pixel most adjacent to one corner of the display area DA of the fourth display device DD4 and an adjacent pixel adjacent to the edge pixel in a row direction (e.g., the second direction DR2) or a column direction (e.g., the first direction DR1), and the narrow part 130 may be disposed between the edge pixel and the adjacent pixel with respect to the row direction or the column direction. For example, the narrow part 130 may be disposed between the (1_1)th pixel PXL1_1 and the (1_2)th pixel PXL1_2 with respect to the second direction DR2. In other embodiments, the narrow part 130 may be disposed between the (1_1)th pixel PXL1_1 and the (2_1)th pixel PXL2_1 with respect to the first direction DR1. However, the embodiments are not limited thereto, and the narrow part 130 may be disposed in various areas adjacent to the (1_1)th pixel PXL1_1. For example, although not shown in the drawing, the narrow part 130 may be disposed to overlap with the (1_1)th pixel PXL1_1 along the second direction DR2. The narrow part 130 may be disposed to overlap with the (1_1)th pixel PXL1_1 along the first direction DR1.

The second lower electrode layer BML2 may be recognized as one corner area of the fourth display device DD4 from the outside. The position of the narrow part 130 corresponds to the (1_1)th pixel PXL1_1 adjacent to a corner of the fourth display device DD4, so that the alignment position of the fourth display device DD4 may be clearly determined.

Figure 11:
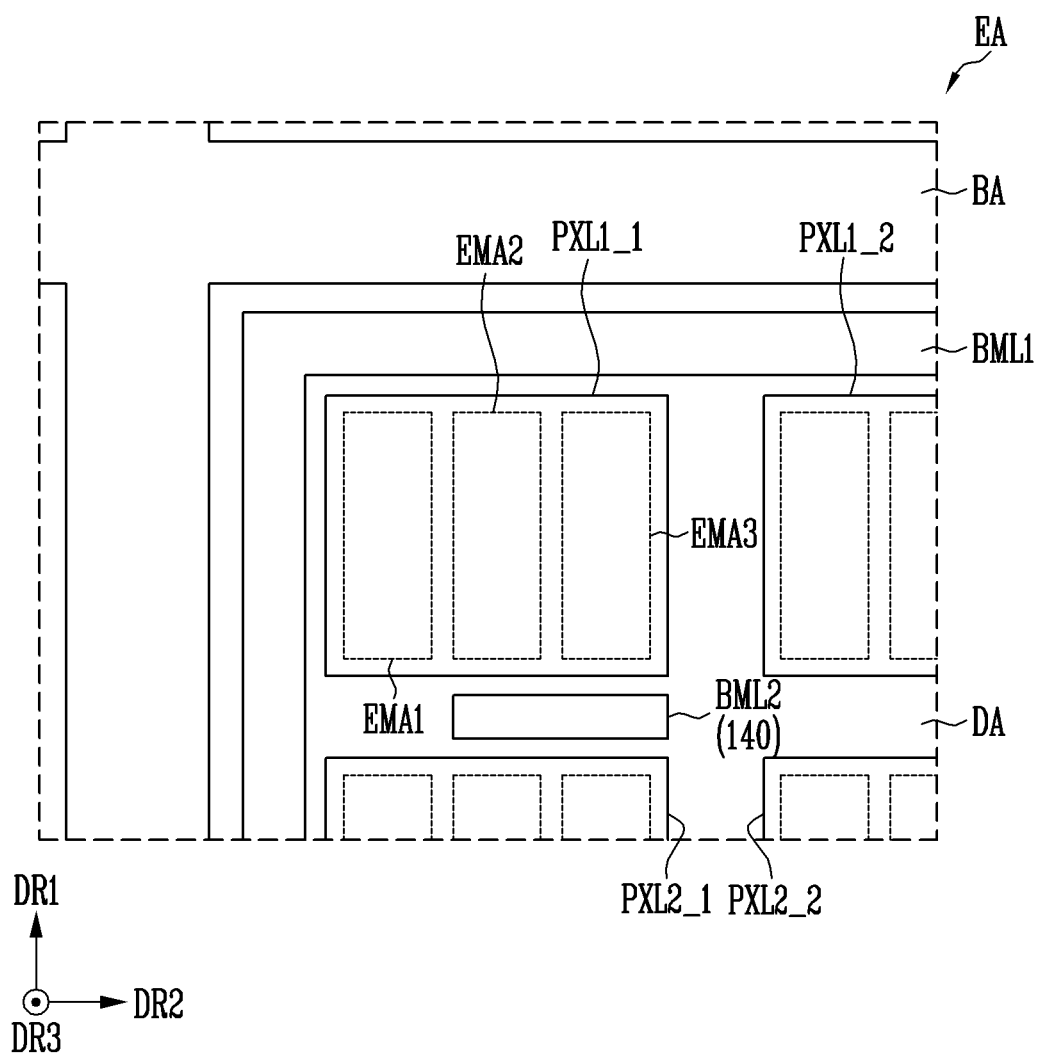
Figure 12:
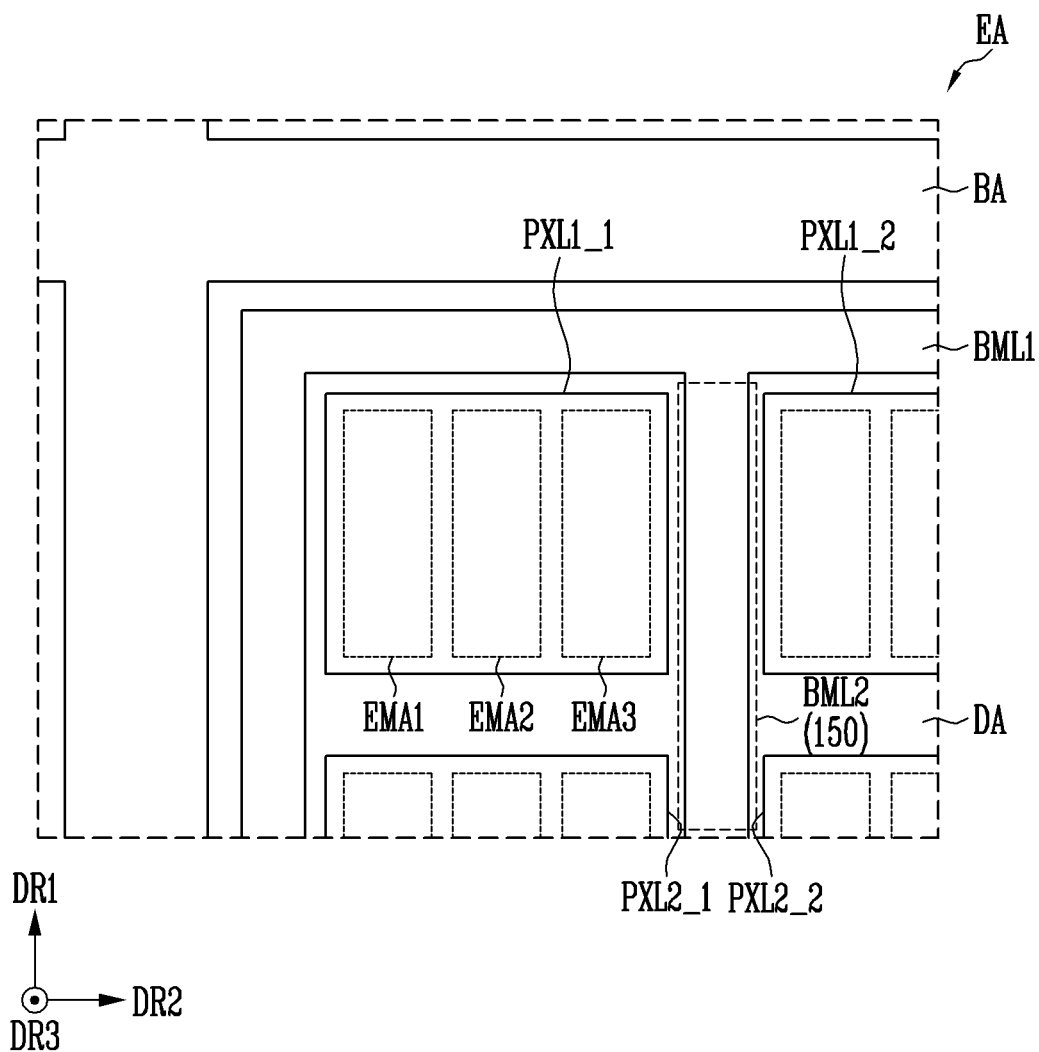

In FIGS. 11 and 12, an embodiment in which a portion of the lower electrode layer BML that may perform an alignment key function may be disposed between adjacent pixels PXL is illustrated. In FIGS. 11 and 12, like FIGS. 8 to 10, the area EA shown in FIG. 7 is enlarged and illustrated. However, for convenience, it is not illustrated in FIG. 7 that the alignment key area AKR may be disposed between pixels PXL.

Referring to FIG. 11, the second lower electrode layer BML2 may be located between pixels PXL adjacent to each other. The second lower electrode layer BML2 may be an isolation part 140. The isolation part 140 may perform an alignment key function on the fourth display device DD4. The isolation part 140 may be included in the fourth alignment key area AKR4 in a plan view. The isolation part 140 may be physically spaced apart from the first lower electrode layer BML1 surrounding the outside of the display area DA.

The isolation part 140 may be adjacent to one corner area of the fourth display device DD4. For example, the isolation part 140 may be adjacent to the (1_1)th pixel PXL1_1.

The fourth display device DD4 may include an edge pixel most adjacent to one corner of the display area DA and an adjacent pixel adjacent to the edge pixel in a row direction (e.g., the second direction DR2) or a column direction (e.g., the first direction DR1), and the isolation part 140 may be disposed between the edge pixel and the adjacent pixel with respect to the row direction or the column direction. For example, the isolation part 140 may be disposed between the (1_1)th pixel PXL1_1 and the (2_1)th pixel PXL2_1. Although not shown in FIG. 11, the isolation part 140 may be disposed between the (1_1)th pixel PXL1_1 and the (1_2)th pixel PXL1_2.

The isolation part 140 may be recognized as one corner area of the fourth display device DD4 from the outside. The isolation part 140 is located between the (1_1)th pixel PXL1_1 and a pixel PXL adjacent to the (1_1)th pixel PXL1_1, i.e., is disposed to correspond to the corner area of the fourth display device DD4, so that the alignment position of the fourth display device DD4 may be clearly determined.

Referring to FIG. 12, the second lower electrode layer BML2 may extend to an area in which the pixels PXL are disposed from the first lower electrode layer BML1. The second lower electrode layer BML2 may be an extending part 150. The extending part 150 may extend to the display area DA from the first lower electrode layer BML1. The extending part 150 may perform an alignment key function on the fourth display device DD4. The extending part 150 may be included in the fourth alignment key area AKR4 in a plan view.

The extending part 150 may be adjacent to one corner area of the fourth display device DD4. For example, the extending part 150 may be adjacent to the (1_1)th pixel PXL1_1.

The fourth display device DD4 may include an edge pixel most adjacent to one corner of the display area DA and an adjacent pixel adjacent to the edge pixel in a row direction (e.g., the second direction DR2) or a column direction (e.g., the first direction DR1), and the extending part 150 may be disposed between the edge pixel and the adjacent pixel with respect to the row direction or the column direction. For example, at least a portion of the extending part 150 may be disposed between the (1_1)th pixel PXL1_1 and the (1_2)th pixel PXL1_2. Although not shown in FIG. 12, the extending part 150 may also be located between the (1_1)th pixel PXL1_1 and the (2_1)th pixel PXL2_1.

The extending part 150 may be recognized as one corner area of the fourth display device DD4 from the outside. The extending part 150 is located between the (1_1)th pixel PXL1_1 and a pixel PXL adjacent to the (1_1)th pixel PXL1_1, i.e., is disposed to correspond to the corner area of the fourth display device DD4, so that the alignment position of the fourth display device DD4 may be clearly determined.

According to the tiled display device TDD in accordance with the embodiment, a structure which performs an alignment key function for aligning each of the display devices DD during a process is provided, so that a separate alignment key for the process is not required, thereby reducing process cost. Further, a portion of the lower electrode layer BML formed along an outer area of the display device DD is formed to be recognizable, thereby perform an alignment key function. Accordingly, any separate additional process is not required, so that the process cost may be further reduced.

According to the tiled display device TDD in accordance with the embodiment, the degree of design freedom of the bonding area BA may be improved. In a conventional tiled display device, a process (e.g., a photolithography process or an optical inspection process) is performed after a separate alignment key is disposed in an area between individual panels of the tiled display device. Since the alignment key is to be disposed in the area between the individual panels, the distance between the individual panels in the conventional tiled display device may be required to be greater than a minimum distance or more. The visibility of the conventional tiled display device is reduced due to the distance required between the individual panels spaced apart from each other. However, in the tiled display device TDD in accordance with the embodiment, a structure which performs the alignment key function is already provided in each of the display devices DD, so a separate alignment key structure is not required when a process is performed. Furthermore, since a separate alignment key arrangement is not required when the process is performed in the bonding area between the display devices DD, the bonding area BA may be implemented to have a narrower distance. Consequently, the external visibility may be improved with the tiled display device TDD in accordance with the embodiment.

In accordance with the disclosure, a tiled display device is provided that has a structure for performing an alignment key function when a manufacturing process is performed, so that process cost is reduced and the distance between individual panels of the tiled display device is reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:
1. A tiled display device comprising:
a first display device and a second display device, each of the first display device and the second display device including a display area and a non-display area, wherein
the first display device and the second display device are adjacent to each other, the first display device includes:
a lower electrode layer;
an alignment key area that performs an alignment key function when a process is performed on the tiled display device; and
a transistor located on a substrate,
the lower electrode layer includes:
a first lower electrode layer that surrounds the display area of the first display device;
a second lower electrode layer disposed in the alignment key area; and
a third lower electrode layer that overlaps the transistor,
the lower electrode layer is disposed under the transistor,
the first lower electrode layer and the second lower electrode layer are integral with each other and are spaced apart from the third lower electrode layer, and
the first lower electrode layer, the second lower electrode layer, and the third lower electrode layer include a same material.

2. The tiled display device of claim 1, wherein the second lower electrode layer performs the alignment key function.

3. The tiled display device of claim 1, wherein the alignment key area includes:
a first alignment key area; and
a second alignment key area that does not overlap with the first alignment key area in a plan view.

4. The tiled display device of claim 3, wherein
the first alignment key area is disposed at a corner of the first display device, and
the second alignment key area is disposed at another corner of the first display device.

5. The tiled display device of claim 1, wherein
the first lower electrode layer extends in a first direction, and
at least a portion of the second lower electrode layer extends in a direction non-parallel to the first direction.

6. The tiled display device of claim 5, wherein
the first display device includes a plurality of pixels arranged in a matrix form, the plurality of pixels include:
an edge pixel most adjacent to at least one of corners of the display area; and
an adjacent pixel adjacent to the edge pixel in a row direction, and
the second lower electrode layer is disposed between the edge pixel and the adjacent pixel in the row direction.

7. The tiled display device of claim 5, wherein
the first display device includes a plurality of pixels arranged in a matrix form,
the plurality of pixels include:
an edge pixel most adjacent to at least one of corners of the display area; and
an adjacent pixel adjacent to the edge pixel in a column direction, and
the second lower electrode layer is disposed between the edge pixel and the adjacent pixel in the column direction.

8. The tiled display device of claim 1, wherein the second lower electrode layer has a shape protruding from the first lower electrode layer.

9. The tiled display device of claim 8, wherein
the first display device includes a plurality of pixels arranged in a matrix form,
the plurality of pixels include an edge pixel most adjacent to at least one of corners of the display area, and
the second lower electrode layer overlaps the edge pixel along at least one of a row direction and a column direction.

10. The tiled display device of claim 1, wherein the second lower electrode layer is spaced apart from the first lower electrode layer in a plan view.

11. The tiled display device of claim 10, wherein
the first display device includes a plurality of pixels arranged in a matrix form,
the plurality of pixels include:
an edge pixel most adjacent to at least one of corners of the display area; and
an adjacent pixel adjacent to the edge pixel in a column direction, and
the second lower electrode layer is disposed between the edge pixel and the adjacent pixel.

12. The tiled display device of claim 10, wherein
the first display device includes a plurality of pixels arranged in a matrix form,
the plurality of pixels include:
an edge pixel most adjacent to at least one of corners of the display area; and
an adjacent pixel adjacent to the edge pixel in a row direction, and
the second lower electrode layer is disposed between the edge pixel and the adjacent pixel.

13. The tiled display device of claim 1, wherein at least a portion of the second lower electrode layer extends from at least a portion of the first lower electrode layer.

14. The tiled display device of claim 13, wherein
the first display device includes a plurality of pixels arranged in a matrix form,
the plurality of pixels include:
an edge pixel most adjacent to at least one of corners of the display area; and
an adjacent pixel adjacent to the edge pixel in a row direction, and
the second lower electrode layer is disposed between the edge pixel and the adjacent pixel.

15. The tiled display device of claim 1, wherein
the first lower electrode layer has a first width, and
the second lower electrode layer has a second width, and
the second width is smaller than the first width.

16. The tiled display device of claim 15, wherein
the first display device includes a plurality of pixels arranged in a matrix form,
the plurality of pixels include:
an edge pixel most adjacent to at least one of corners of the display area; and
an adjacent pixel adjacent to the edge pixel in a row direction, and
the second lower electrode layer is located between the edge pixel and the adjacent pixel in the row direction.

17. The tiled display device of claim 15, wherein
the first display device includes a plurality of pixels arranged in a matrix form,
the plurality of pixels include:
an edge pixel most adjacent to at least one of corners of the display area; and
an adjacent pixel adjacent to the edge pixel in a column direction, and
the second lower electrode layer is located between the edge pixel and the adjacent pixel in the column direction.

18. The tiled display device of claim 1, wherein a shape of each of the first display device and the second display device is at least one of a triangular shape, a rectangular shape, a hexagonal shape, and a trigonal pyramid shape.

\* \* \* \* \*